United States Patent [19]

Hosali et al.

[11] Patent Number: 5,738,800
[45] Date of Patent: Apr. 14, 1998

[54] COMPOSITION AND METHOD FOR POLISHING A COMPOSITE OF SILICA AND SILICON NITRIDE

[75] Inventors: Sharath D. Hosali, Newark, Del.; Anantha R. Sethuraman, Avondale, Pa.; Jiun-Fang Wang, Hockessin, Del.; Lee Melbourne Cook, Steelville, Pa.

[73] Assignee: Rodel, Inc., Newark, Del.

[21] Appl. No.: 802,829

[22] Filed: Feb. 19, 1997

Related U.S. Application Data

[60] Provisional application No. 60/027,277 Sep. 27, 1996.
[51] Int. Cl.$^6$ .................................. H01L 21/304
[52] U.S. Cl. ...................... 216/99; 216/89; 216/97
[58] Field of Search ................... 216/89, 88, 97, 216/99, 38

[56] References Cited

U.S. PATENT DOCUMENTS

| | | | |
|---|---|---|---|
| 4,448,634 | 5/1984 | Lampert | 156/636 |
| 4,526,631 | 7/1985 | Silvestri et al. | 148/175 |
| 4,671,851 | 6/1987 | Beyer et al. | 156/645 |
| 5,391,258 | 2/1995 | Brancaleoni et al. | 156/636 |
| 5,445,996 | 8/1995 | Kodera et al. | 437/225 |
| 5,476,606 | 12/1995 | Brancaleoni et al. | 252/79.1 |
| 5,502,007 | 3/1996 | Murase | 437/225 |

*Primary Examiner*—R. Bruce Breneman
*Assistant Examiner*—George Goudreau
*Attorney, Agent, or Firm*—Kenneth A. Benson

[57] ABSTRACT

A composition is provided for polishing a composite comprised of silica and silicon nitride comprising: an aqueous medium, abrasive particles, a surfactant, and a compound which complexes with the silica and silicon nitride wherein the complexing agent has has two or more functional groups each having a dissociable proton, the functional groups being the same or different.

8 Claims, No Drawings

COMPOSITION AND METHOD FOR POLISHING A COMPOSITE OF SILICA AND SILICON NITRIDE

This application claims the benefit of U.S. Provisional application Ser. No. 60/027,277 filed Sep. 27, 1996.

BACKGROUND OF THE INVENTION

1. Field of the Invention

The present invention relates to compositions which are useful as slurries for the chemical-mechanical polishing of substrates, especially substrates comprised of silica and silicon nitride. More specifically the slurries of the present invention include an aqueous medium, abrasive particles, a surfactant, and a compound which complexes with silica and silicon nitride.

2. Description of Related Art

In integrated circuit technology, various active and passive elements generally must be isolated from one another within the integrated circuit structure. This has often been accomplished by deep or shallow trench isolation techniques. These techniques typically use silicon dioxide (silica) as a dielectric material and silicon nitride as a stop layer, requiring chemical-mechanical polishing (planarization) of each circuit layer. To achieve efficient polishing and adequate planarization, a polishing slurry is generally useful and should provide a high selectivity involving the removal rate of silica relative to silicon nitride.

In Silvestri et al., U.S. Pat. No. 4,526,631, a slurry of 6 weight percent colloidal silica adjusted to a pH of about 12 with KOH provides a polishing ratio of about 10 $SiO_2$ to 1 $Si_3N_4$. Beyer et al., U.S. Pat. No. 4,671,851, states that the polishing ratios between $SiO_2$ and $Si_3N_4$ preferably should be between a lower limit of 4 to 1 and a higher limit of 40 to 1. Beyer describes obtaining a ratio of 6.2 to 1 using a colloidal silica in water with small amounts of a sodium salt of dichloroisocyanuric acid and sodium carbonate.

Even more recent patents such as Murase, U.S. Pat. No. 5,502,007, also describe obtaining selectivities of about 10 $SiO_2$ to 1 $Si_3N_4$ removal rates using a colloidal silica slurry as a polishing agent. Kodera et al., U.S. Pat. No. 5,445,996, use ceria as well as silica for the abrasive particles in slurries, but they also report selectivities for $SiO_2$ to $Si_3N_4$ removal rates in the range of 2 to 3.

SUMMARY OF THE INVENTION

A composition is provided for polishing a composite comprised of silica and silicon nitride comprising: an aqueous medium, abrasive particles, a surfactant and a compound which complexes with the silica and silicon nitride wherein the complexing agent has two or more functional groups each having a dissociable proton, the functional groups being the same or different.

A further aspect of the invention is the method for polishing a composite comprised of silica and silicon nitride comprising: applying a slurry at a polishing interface between a polishing pad and the composite comprised of silica and silicon nitride, the slurry comprising: an aqueous medium, abrasive particles, a surfactant and a compound which complexes with the silica and silicon nitride wherein the complexing agent has two or more functional groups each having a dissociable proton, the functional groups being the same or different.

DESCRIPTION OF THE PREFERRED EMBODIMENTS

It has been found that the addition of a compound which complexes with silica and silicon nitride to polishing slurries used in the chemical-mechanical polishing of composites comprised of silica and silicon nitride can provide a very high selectivity of rate of removal of $SiO_2$ to the rate of removal of $Si_3N_4$ when a surfactant is used in conjunction with the complexing agent and when the concentration of the complexing agent in the slurry is sufficient to block the removal of $Si_3N_4$ while not greatly affecting the removal of $SiO_2$ at the pH of the polishing slurry.

Compounds which act as complexing agents or chelating agents for $SiO_2$ and $Si_3N_4$ are described in great detail in U.S. Pat. No. 5,391,258 and U.S. Pat. No. 5,476,606 which are made part of this specification by reference. These compounds must have at least two acid groups present in the structure which can affect complexation to the silica and silicon nitride surface. Acid species are defined as those functional groups having a dissociable proton. These include, but are not limited to, carboxylate, hydroxyl, sulfonic and phosphonic groups. Carboxylate and hydroxyl groups are preferred as these are present in the widest variety of effective species. Particularly effective are structures which possess two or more carboxylate groups with hydroxyl groups in an alpha position, such as straight chain mono- and di-carboxylic acids and salts including, for example, malic acid and malates, tartaric acid and tartarates and gluconic acid and gluconates. Also effective are tri- and polycarboxylic acids and salts with secondary or tertiary hydroxyl groups in an alpha position relative to a carboxylic group such as citric acid and citrates. Also effective are compounds containing a benzene ring such as ortho di- and polyhydroxybenzoic acids and acid salts, phthalic acid and acid salts, pyrocatecol, pyrogallol, gallic acid and gallates and tannic acid and tannates. In the examples to follow, a salt of phthalic acid is used as the complexing agent and, therefore, such salts are preferred complexing agents for this invention. Potassium hydrogen phthalate, "KHP", was the phthalate salt used in the experiments described below.

The surfactant used in conjunction with the complexing agent in this invention is not present to perform the usual function of surfactants in slurries of stabilizing the particulate dispersion. As shown in the examples which follow, the surfactant in combination with the complexing agent affects the rate of removal of $Si_3N_4$ from the composite surface. It is believed that any surfactant, whether it be an anionic, cationic, non-ionic or zwitter-ionic surfactant, might be effective in the compositions of this invention. Particularly useful would be fluorocarbons or hydrocarbons with phosphate end groups. In the following examples several different surfactants were shown to be effective. "ZFSP", ZONYL™ FSP Fluorosurfactant, manufactured by the DuPont Company, was shown to be a particularly effective surfactant additive to the slurries of this invention. It is a long straight chain hydrocarbon with phosphate groups at one end and a fluoride at the other end.

In these examples, ceria was used for the abrasive particles in the slurry because it is an effective polishing abrasive for chemical-mechanical polishing at all pH conditions and is stable against gelation. Any other polishing abrasive, such as alumina, zirconia, silica, titania and barium carbonate could also be used.

To adjust the slurries of this invention to the pH range in which the highest selectivities of $SiO_2$ removal to $Si_3N_4$ removal are obtained any base or amine compound might be used. In the examples to follow KOH is used to adjust the pH of the slurry compositions. Potassium hydroxide, ammonium hydroxide, and all types of soluble amine compounds may be used to adjust the pH of chemical-mechanical polishing slurries.

EXAMPLE 1

Table 1 shows the results of polishing silicon dioxide and silicon nitride wafers with slurries containing various amounts of complexing agent at selected pH levels. These experiments were carried out on a Strasbaugh 6DS SP Planarizer using an IC 1000/SubaIV polishing pad stack under the conditions of 7 psi down pressure, 1.5 psi back pressure, 30 rpm carrier speed and 32 rpm table speed with a slurry flow rate of 125 ml/min. 6 inch wafers were used and the pad was conditioned after each wafer was polished. All slurries in this series of experiments contained 0.45% colloidal ceria and 0.2% ZFSP surfactant and the pH of the slurry was adjusted using potassium hydroxide.

TABLE 1

| Sample | % KHP* | pH | RR $SiO_2$ | RR $Si_3N_4$ | Selectivity |
|---|---|---|---|---|---|
| 1 | 0 | 4 | 1419 | 256 | 5.5 |
| 2 | 3.1 | 4 | 6 | 3 | 2 |
| 3 | 0.5 | 7 | 3019 | 189 | 16 |
| 4 | 1 | 7 | 3000 | 15 | 200 |
| 5 | 3.1 | 7 | 1185 | 4 | 296 |
| 6 | 1 | 10 | 3397 | 994 | 3.5 |
| 7 | 2 | 10 | 3246 | 920 | 3.5 |

*Potassium hydrogen phthalate

These results clearly show that selectivities of silicon dioxide to silicon nitride removal rates much higher than reported heretofore can be obtained by using slurries comprising a complexing agent and a surfactant at a pH level where these additives effectively shut down the removal rate of silicon nitride while not greatly affecting the removal rate of silicon dioxide. As shown above, selectivities of 200 and greater can be obtained by this inventive method of polishing.

EXAMPLE 2

The following experiments show the necessity of using a surfactant in the slurries of this invention. They were carried out on a Strasbaugh 6DS SP Planarizer under the same conditions described in Example I. Slurries were similar to the one used for Sample 4 on Table I in that the slurries were comprised of 1%KHP, 0.45% colloidal ceria and the pH was adjusted to 7 using KOH. Percent surfactant, ZFSP, was either 0.2% as in Sample 4 or 0.0%. Removal rates for $Si_3N_4$ in Angstroms per minute are shown in Table 2 below:

TABLE 2

| % ZFSP | RR $Si_3N_4$ |
|---|---|
| 0 | 793 |
| 0 | 768 |
| 0 | 736 |
| 0.2 | 10 |
| 0.2 | 8 |

It is obvious from these data that the surfactant is critical to the shutting down of the $Si_3N_4$ removal rate so that such extraordinary selectivities can be obtained.

EXAMPLE 3

In the following experiments the abrasive in the slurries was commercial opaline ceria which was milled before use. Polishing of wafers was accomplished under the same conditions as in Example 1. Results are given in Table 3 below:

TABLE 3

| Sample | % Abrasive | % KHP | % ZFSP | pH | RR $SiO_2$ | RR $Si_3N_4$ | Selectivity |
|---|---|---|---|---|---|---|---|
| 8 | 2 | 0 | 0 | 7 | 5804 | 3504 | 2 |
| 9 | 2 | 1 | 0.2 | 7 | 2642 | 22 | 120 |
| 10 | 3.5 | 1 | 0.2 | 6.5 | 3195 | 13 | 246 |
| 11 | 5 | 1 | 0.2 | 6.5 | 3705 | 33 | 112 |
| 12 | 3.5 | 2 | 0.4 | 7 | 2133 | 10 | 212 |
| 13 | 5 | 2 | 0.4 | 7.5 | 3609 | 1105 | 3 |

These results show that a complexing agent and a surfactant effectively shut down the removal rate of $Si_3N_4$ when used in a slurry adjusted to a desired pH range. At a pH of 6.5 and 7 the removal rate of $Si_3N_4$ is greatly shut down giving selectivities for the removal of silica over that of silicon nitride of over 100 (samples 9–12). However, at a pH of 7.5 (sample 13), the removal rate of silicon nitride is no longer depressed and selectivities are very poor.

EXAMPLE 4

In these experiments several surfactants were found to be effective in reducing the removal rate of silicon nitride at a pH of 6.5. The surfactants used were FC-93, Fluorad™ FC-93, an anionic fluorochemical surfactant available from the 3M Company; "PVS", the sodium salt of polyvinyl sulphonate available commercially; and "ZFSN", ZONYL™ FSN, a non-ionic surfactant available from the DuPont Company. The slurries in this Example all contained 1.5% KHP (potassium hydrogen phthalate) and 0.45% commercial opalene ceria as the abrasive. Polishing of wafers was accomplished under the same conditions as in Example 1. Results are given in Table 4 below:

TABLE 4

| Sample | Surfactant | % Surfactant | RR $SiO_2$ | RR $Si_3N_4$ | Selectivity |
|---|---|---|---|---|---|
| 14 | FC-93 | 0.2 | 2975 | 464 | 6 |
| 15 | PVS | 0.3 | 3406 | 35 | 98 |
| 16 | ZFSN | 0.3 | 2678 | 39 | 68 |

These results show that several surfactants are effective in slurries made to reduce the removal rate of silicon nitride. A given surfactant might be even more effective should pH and slurry compositions be optimized.

EXAMPLE 5

In this Example the abrasive used was WS2000 available from Rodel, Inc. WS2000 is an abrasive which contains both ceria and silica. The slurry used for this experiment contained 3.5% abrasive, 1.5% KHP (potassium hydrogen phthalate), and 0.2% ZFSP (ZONYL™ FSP). The pH was about 6.5. Results from the polishing of wafers under the same conditions as in Example 1 are shown on Table 5 below:

TABLE 5

| Sample | RR $SiO_2$ | RR $Si_3N_4$ | Selectivity |
|---|---|---|---|
| 17 | 2209 | 9 | 244 |

The above Examples show many embodiments of this invention and are not meant to restrict the invention in any way. The scope of the invention is defined only by the claims which follow:

We claim:

1. A method of polishing a composite comprised of silica and silicon nitride comprising:

applying a slurry at a polishing interface between a polishing pad and said composite comprised of silica and silicon nitride, said slurry comprising: an aqueous medium, abrasive particles, a surfactant, and a compound which complexes with said silica and silicon nitride, wherein said compound has two or more functional groups each having a dissociable proton, the functional groups being the same or different.

2. A method according to claim 1 wherein said compound which complexes with silica and silicon nitride contains a benzene ring.

3. A method according to claim 1 wherein said compound which complexes with silica and silicon nitride is a straight chain mono- or di-carboxylic acid or salt which has a secondary hydroxyl group in an alpha position relative to a carboxylate group.

4. A method according to claim 1 wherein said compound which complexes with silica and silicon nitride is a tri- or poly-carboxylic acid or salt which has a secondary or tertiary hydroxyl group in an alpha position relative to a carboxylic group.

5. A method according to claim 1 wherein said abrasive particles comprise ceria.

6. A method according to claim 1 wherein said surfactant comprises a fluorosurfactant.

7. A method according to claim 2 wherein said compound which complexes with silica and silicon nitride is potassium hydrogen phthalate.

8. A method according to claim 2 wherein said polishing composition comprises: water, about 0.2% to about 5% ceria, about 0.5% to about 3.5% potassium hydrogen phthalate, about 0.1% to about 0.5% fluorosurfactant, all percentages by weight, and wherein the pH of said polishing composition is adjusted from about 6 to about 7 by the addition of a base or an amine compound to said polishing composition.

* * * * *